United States Patent
Kim

(10) Patent No.: US 7,606,020 B2
(45) Date of Patent: Oct. 20, 2009

(54) LIGHT EXPOSURE APPARATUS

(75) Inventor: Yeong-Hawn Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 301 days.

(21) Appl. No.: 11/295,598

(22) Filed: Dec. 7, 2005

(65) Prior Publication Data

US 2006/0139843 A1    Jun. 29, 2006

(30) Foreign Application Priority Data

Dec. 28, 2004   (KR) ...................... 10-2004-0114300

(51) Int. Cl.
*H01L 21/683* (2006.01)
(52) U.S. Cl. ........................................ 361/234
(58) Field of Classification Search ................ 361/234
See application file for complete search history.

(56) References Cited

U.S. PATENT DOCUMENTS

| | | | | |
|---|---|---|---|---|
| 5,583,737 A | * | 12/1996 | Collins et al. ............... | 361/234 |
| 6,129,546 A | * | 10/2000 | Sada ........................... | 432/253 |
| 6,306,455 B1 | * | 10/2001 | Takamori et al. ............... | 427/8 |
| 6,887,317 B2 | * | 5/2005 | Or et al. ..................... | 118/728 |
| 7,126,808 B2 | * | 10/2006 | Koo et al. .................... | 361/234 |
| 2003/0128308 A1 | * | 7/2003 | Kim ........................... | 349/58 |
| 2004/0196616 A1 | | 10/2004 | Koo et al. | |

FOREIGN PATENT DOCUMENTS

| | | |
|---|---|---|
| JP | 09-148419 | 6/1997 |
| JP | 2000-236014 | 8/2000 |
| JP | 2003-347395 | 12/2003 |

* cited by examiner

*Primary Examiner*—Stephen W Jackson
*Assistant Examiner*—Scott Bauer
(74) *Attorney, Agent, or Firm*—Morgan Lewis & Bockius LLP

(57) ABSTRACT

A light exposure apparatus includes a chuck adapted to receive a substrate on a surface thereof, a plurality of first lift pins in the chuck that are able to move up and down to load/unload the substrate on/from the chuck, and a plurality of second lift pins in the chuck to discharge electrostatic charges of the chuck and the substrate.

18 Claims, 9 Drawing Sheets

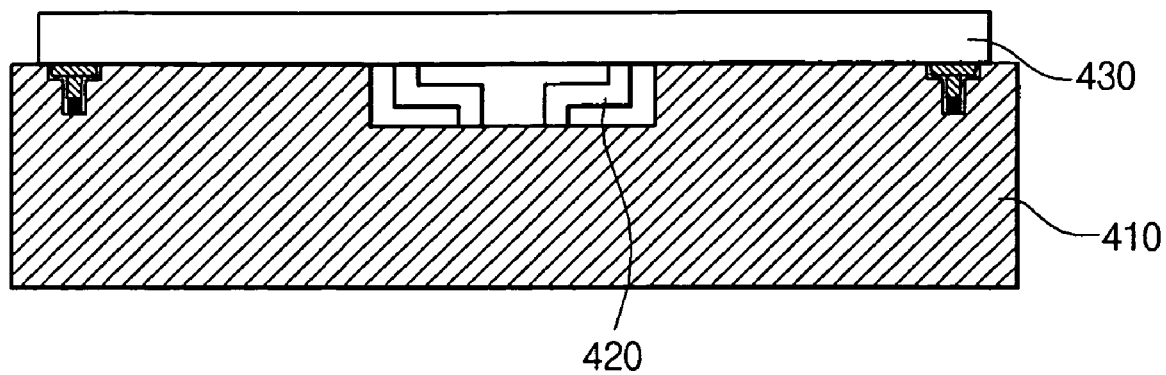
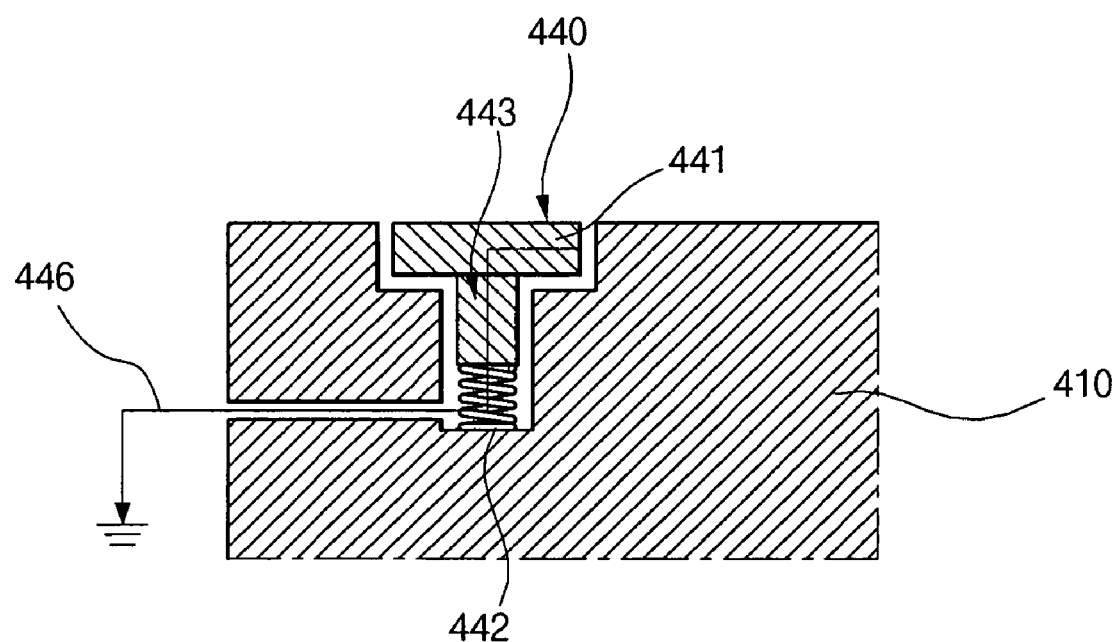

LIGHT EXPOSURE APPARATUS

The present invention claims benefit of Korean Patent Application No. P 2004-0114300, filed in Korea on Dec. 28, 2004, which is hereby incorporated by reference.

BACKGROUND OF THE INVENTION

1. Field of the Invention

The present invention relates to a light exposure apparatus, and more particularly, to a light exposure apparatus suitable for fabrication of a liquid crystal display (LCD) and capable of preventing static electricity thereon.

2. Discussion of the Related Art

Until recently, cathode-ray tubes (CRTs) have been utilized as display devices. Presently, much effort is being expended to study and develop various types of flat panel displays, such as LCD devices, plasma display panels (PDPs), field emission displays, and electro-luminescence displays (ELDs), as substitutes for the CRTs.

The flat panel display usually includes a light emitting layer or a light polarizing layer on at least one transparent substrate. There is an active matrix type flat panel display, which includes a plurality of thin film transistors (TFTs) arranged in a matrix manner. This active matrix type flat panel display is becoming widely utilized because of its high resolution and high ability of displaying moving images.

The flat panel display has a multi-laminated structure, which is fabricated through the repetition of a thin film-depositing process, a photolithography process and a thin film-etching process. The photolithography process transfers patterns of a photo-mask to the deposited thin film on a substrate by depositing a photoresist on the deposited thin film on the substrate, aligning the substrate and exposing the deposited thin film on a light. In particular, the light-exposing process is performed utilizing a light exposure apparatus.

FIG. 1 is a schematic plan view of a light-exposing apparatus 100 according to the related art. As shown in FIG. 1, the light exposure apparatus 100 includes a chuck 110, a light source 160 and a photo-mask 150. A substrate 130, on which a thin film 131 and a photoresist layer 140 are formed, is placed on the chuck 110. The chuck 110 supports the substrate 130 during a light-exposing process. Also, the chuck 110 includes plurality of lift pins 120 that are able to move up and down to load and unload the substrate 130. The light source 160 emits a UV (ultra-violet) light toward the substrate 130. The photo-mask 150 has predetermined patterns selectively transmitting and blocking the emitted light from the light source 160. Accordingly, the photoresist layer 140 on the chuck 110 is exposed to the UV light that is emitted from the light source 160 and passes through the photo-mask 150. Then, the photoresist layer 140 is developed to form a photoresist pattern, by which the thin film 131 is patterned.

FIG. 2 is a schematic plan view of the chuck 110 for the related art light exposure apparatus 100. As shown in FIG. 2, a recess portion 116 is formed in a center portion of the chuck 110. Corners of the recess portion 116 are extended along two diagonal lines of the recess portion 116. A plurality of lift pins 120 are symmetrically arranged in the recess portion 116. Specifically, there are four lift pins 120 arranged at the extended four corners along two diagonal lines. The plurality of lift pins 120 are able to move up and down to load and unload the substrate 130. A plurality of vacuum holes 118 are arranged in an upper surface of the chuck 110. When the substrate 130 is loaded on the upper surface of the chuck 110, the vacuum holes 118 are inhaled to be under vacuum so that the substrate 130 can be tightly attached to the upper surface of the chuck 110.

FIG. 3A is a schematic cross-sectional view illustrating the related art chuck 110 and the substrate 130 when the lift-pin 120 is in an up position, and FIG. 3B is a schematic cross-sectional view illustrating the related art chuck 110 and the substrate 130 when the lift pin 120 is in a down position. As shown in FIGS. 3A and 3B, when the lift pin 120 is in the up position, a robot places the substrate 130 on the lift pin 120. Then, the lift pin 120 moves down to the down position thereby placing the substrate 130 on the upper surface of the chuck 110. After that, the vacuum hole 118 (of FIG. 2) is inhaled to be under vacuum so that the substrate 130 can closely adhere to the upper surface of the chuck 110.

When the substrate 130 adheres to the upper surface of the chuck 110, the light emitted from the light source 160 (of FIG. 1) and passing through the photo-mask (150 of FIG. 1) irradiates the photoresist layer 140 (of FIG. 1) to conduct a light-exposing process. After the light-exposing process is completed, the lift pin 120 moves up to the up position so that the robot holds up and transfers the substrate 130 for a following process.

According to the related art, however, when the lift pin 120 is in the up position as shown in FIG. 3A, peripheral portions of the substrate 130 are bent downward. Therefore, when the lift pin 120 moves down to load the substrate 130 on the chuck 110, the bent peripheral portions of the substrate 130 contact the upper surface of the chuck 110 earlier than the rest portions of the substrate 130, thereby generating frictions between the peripheral portions of the substrate 130 and the upper surface of the chuck 110. Due to the frictions, the chuck 110 has positive electrostatic charges at its edge portions. Further, the positive electrostatic charges remain in the edge portions of the chuck 110. For this reason, when the lift pin 120 moves up to the up position to unload the substrate 130, a spark discharge is generated due to static electricity at edges of the substrate 130, in particular at corners of the substrate 130. The discharge increases a burden on the lift pin 120, thereby causing operational errors of the light exposure apparatus 100 (of FIG. 1).

SUMMARY OF THE INVENTION

Accordingly, the present invention is directed to a light exposure apparatus that substantially obviates one or more of the problems due to limitations and disadvantages of the related art.

An object of the present invention is to provide a light exposure apparatus that is suitable for fabrication of a liquid crystal display (LCD).

Another object of the present invention is to provide a light exposure apparatus that is capable of preventing static electricity thereon.

Another object of the present invention is to provide a light exposure apparatus that is capable of minimizing operation errors thereof.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the light exposure apparatus suitable of fabrication of a liquid crystal display includes a chuck adapted to receive a substrate on a surface thereof, a plurality of first lift pins in the chuck that are able to move up and down to load and unload the substrate on the surface of the chuck, and a plurality of second lift pins in the chuck to discharge electrostatic charges of the chuck and the substrate.

In another aspect, an apparatus for fabricating a substrate includes a chuck adapted to receive the substrate on a surface thereof, a plurality of first lift pins in the chuck that are able to move up and down to load and unload the substrate on the surface of the chuck, and a plurality of second lift pins in the chuck to discharge electrostatic charges of the chuck and the substrate.

In another aspect, a light exposure apparatus for fabricating a substrate of a liquid crystal panel includes a light source adapted to emit ultra-violet light, a photo mask including predetermined patterns that selectively transmit and block the light emitted from the light source, a chuck adapted to support the substrate that is exposed to the light through the photo mask, and a plurality of first lift pins in the chuck that are able to move up and down to load/unload the substrate on/from the chuck, wherein the chuck is provided with a mechanism to reduce a burden of the plurality of first lift pins and to discharge electrostatic charges of the chuck and the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 6C and 6D are cross-sectional views of a chuck and an ESD lift pin, respectively, for a light exposure apparatus according to an exemplary embodiment of the present invention when adhering a substrate to the chuck.

DETAILED DESCRIPTION OF THE PREFERRED EMBODIMENTS

Figure 1:
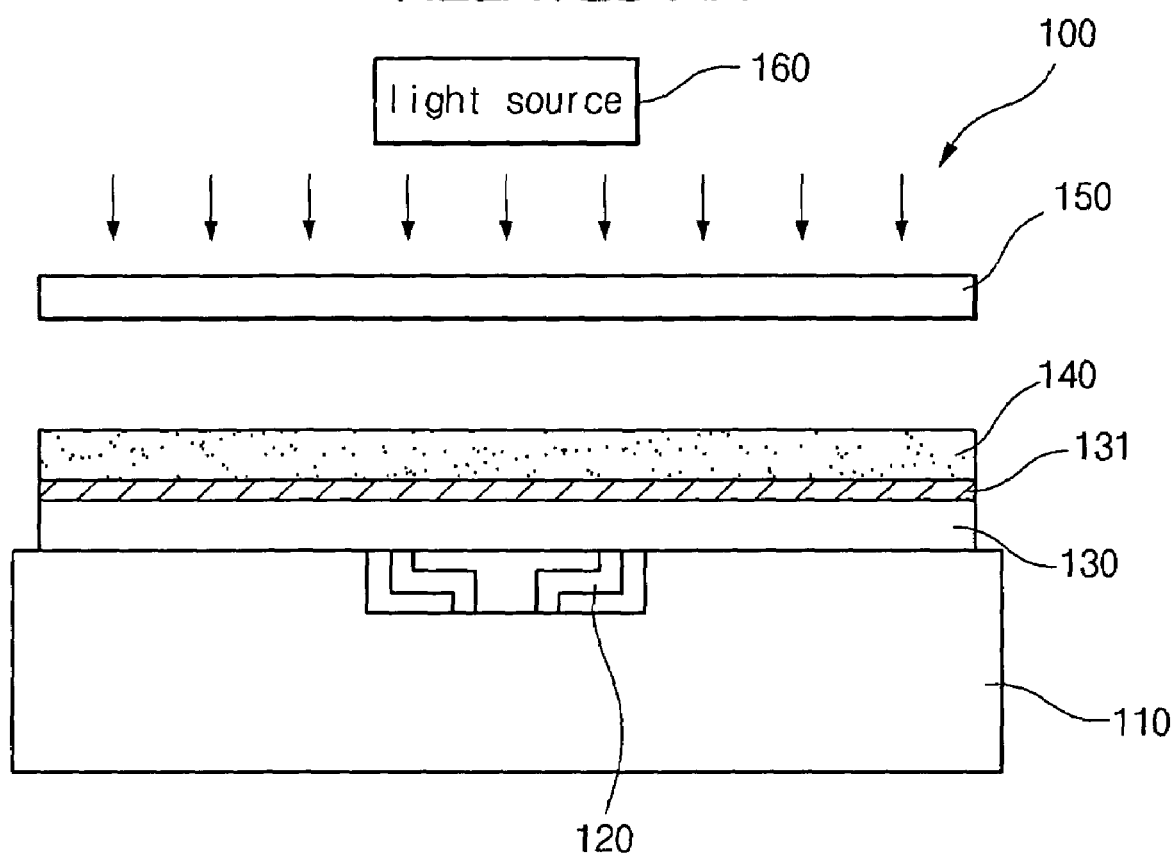
FIG. 1 is a schematic plan view of a light-exposing apparatus according to the related art.
Figure 2:
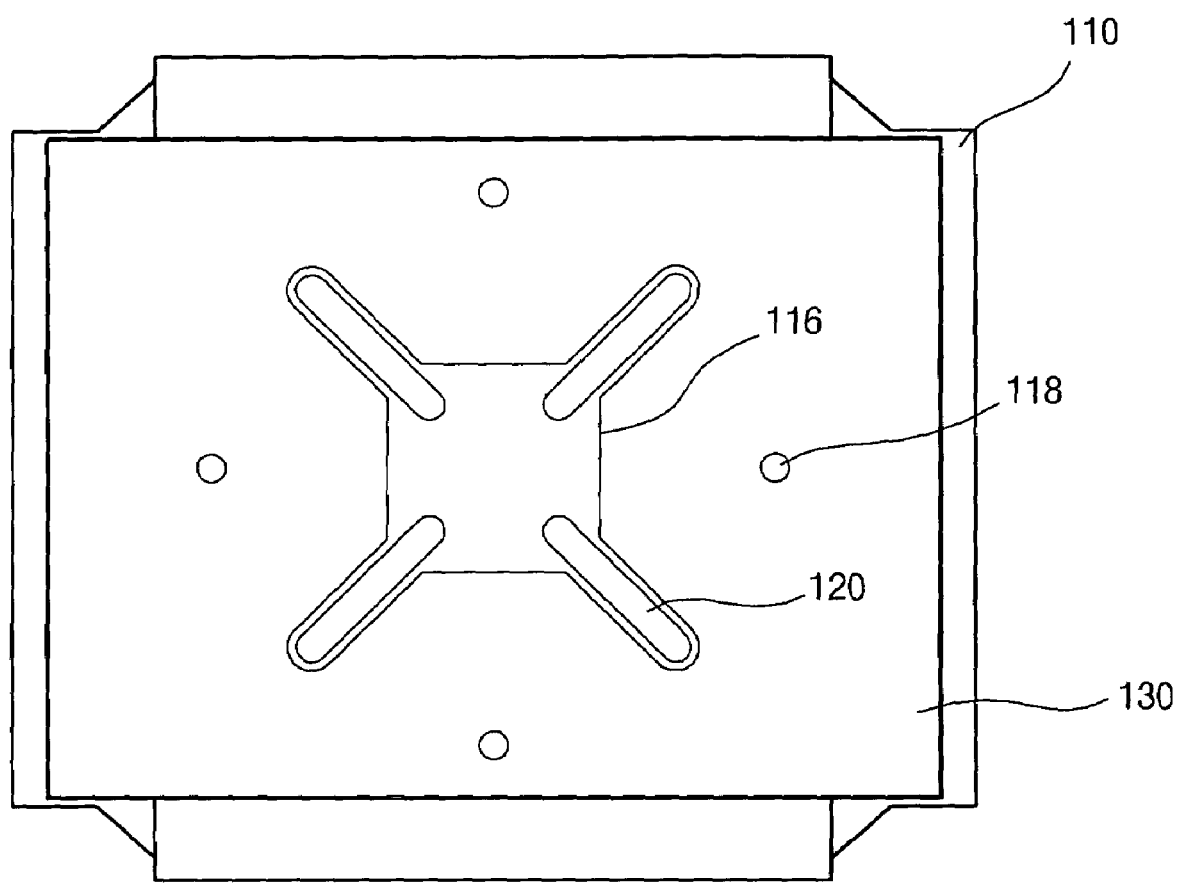
FIG. 2 is a schematic plan view of a chuck of the related art light exposure apparatus of FIG. 1.
Figure 3A:
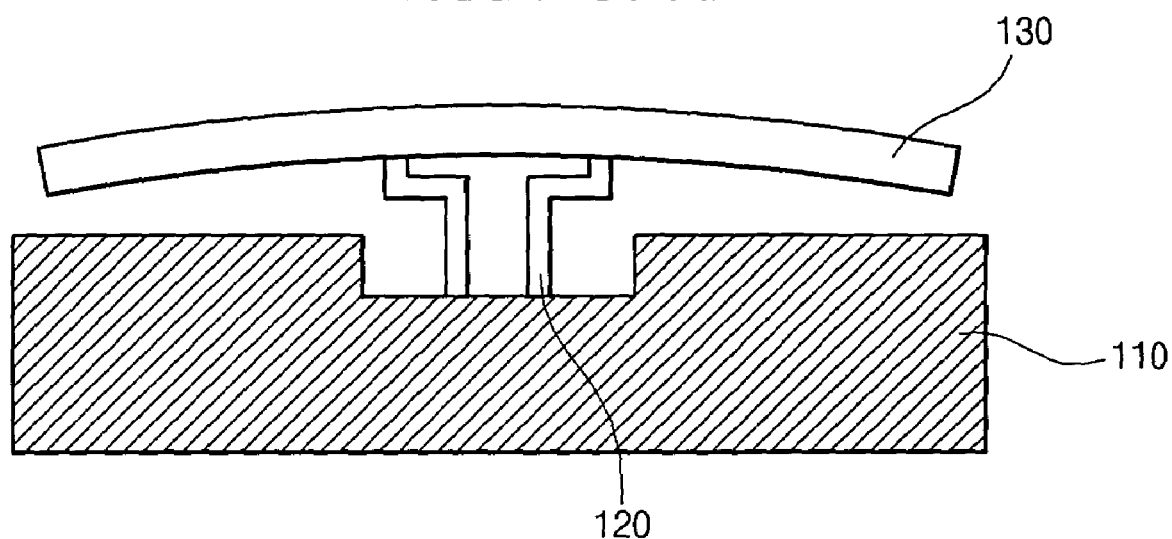
FIG. 3A is a schematic cross-sectional view illustrating the related art chuck and a substrate when a lift-pin is in an up position.
Figure 3B:
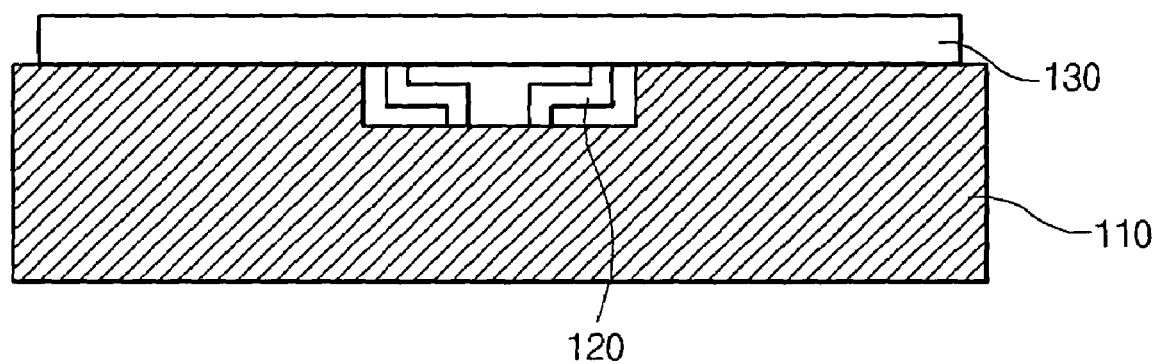
FIG. 3B is a schematic cross-sectional view illustrating the related art chuck and a substrate when a lift pin is in a down position.

Reference will now be made in detail to the illustrated embodiments of the present invention, which are illustrated in the accompanying drawings. The light exposure apparatus of the present invention is similar to the light exposure apparatus 100 of FIG. 1 except that the light exposure apparatus of the present application is provided with a mechanism that is capable of removing the static electricity and minimizing the operation errors thereof. That is, the light exposure apparatus includes the light source 160 and the photomask 150 that are shown in FIG. 1.

Figure 4A:
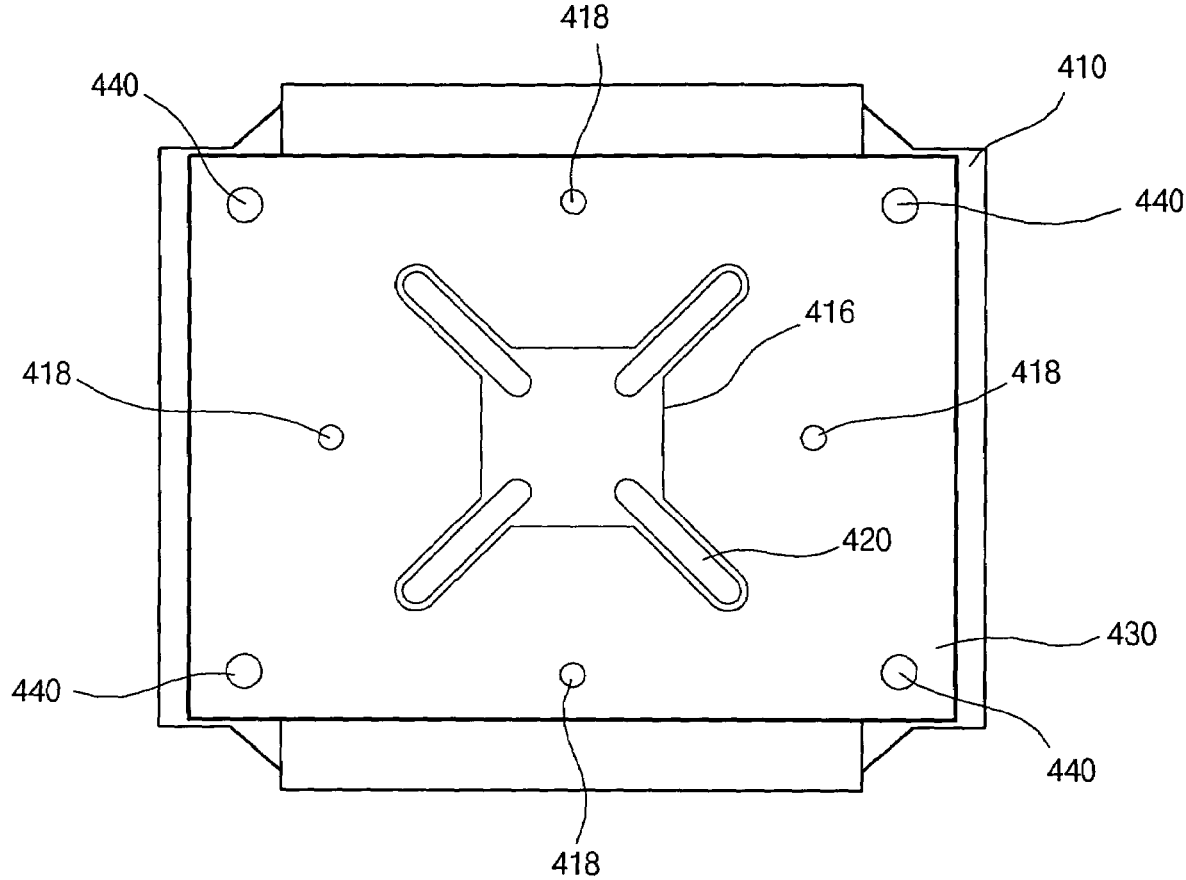
FIG. 4A is a schematic plan view of a chuck for a light exposure apparatus according to an exemplary embodiment of the present invention.
Figure 4B:
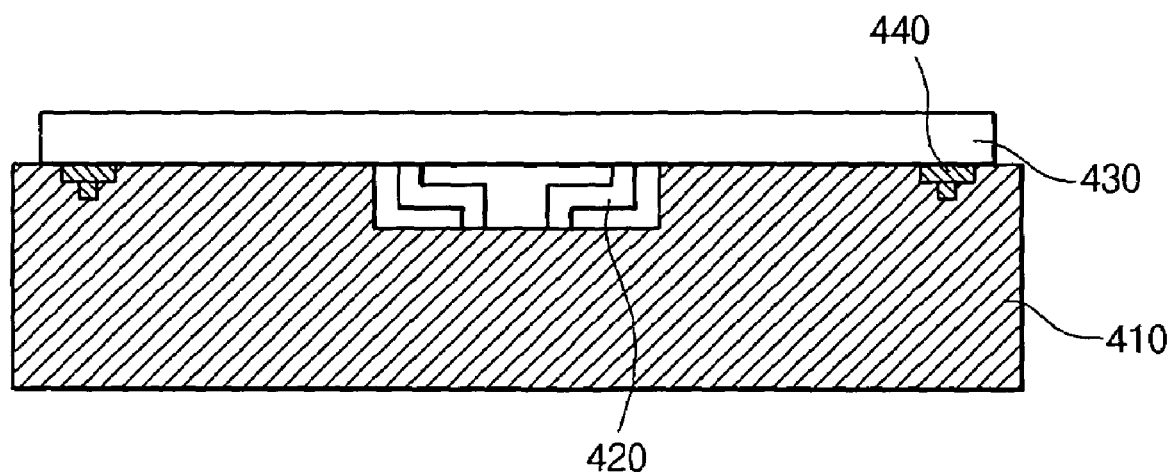
FIG. 4B is a cross-sectional view of the chuck for the light exposure apparatus of FIG. 4A.

FIGS. 4A and 4B are schematic plan and cross-sectional views, respectively, of a chuck 410 for a light exposure apparatus according to an exemplary embodiment of the present invention. As shown in FIGS. 4A and 4B, a recess portion 416 is formed in a center portion of the chuck 410. The recess portion 416 may have a rectangular shape and have four corners extended along two diagonal lines of the recess portion 416. A plurality of lift pins 420 are symmetrically arranged in the recess portion 416. In this exemplary embodiment, there are four lift pins 420 arranged in the extended four corners along the two diagonal lines of the recess portion 416. The lift pins 420 are able to move up and down, thereby loading/unloading the substrate 430 on/from the chuck 410. Also, there are a plurality of vacuum holes 418 arranged in an upper surface of the chuck 410 and outside the recess portion 416. The vacuum holes 418 may be connected to an exterior vacuum pump. In such an arrangement, when the substrate 430 is loaded on the upper surface of the chuck 410, the vacuum holes 418 are inhaled by the exterior vacuum pump until they are under vacuum. Therefore, the substrate 430 can closely adhere to the upper surface of the chuck 410.

Moreover, a plurality of eletrostatic discharge (ESD) lift pins 440 are arranged at edge portions of the upper surface of the chuck 410. In the exemplary embodiment of the present invention, there are four ESD lift pins 440 arranged at four corners of the upper surface of the chuck 410 corresponding to four corners of the substrate 430. The ESD lift pins 440 serve to discharge electrostatic charges when the electrostatic charges are generated at the chuck 410 and the substrate 430. Hereinafter, the ESD lift pins 440 will be explained in more detail with reference to FIGS. 5A and 5B.

Figure 5A:
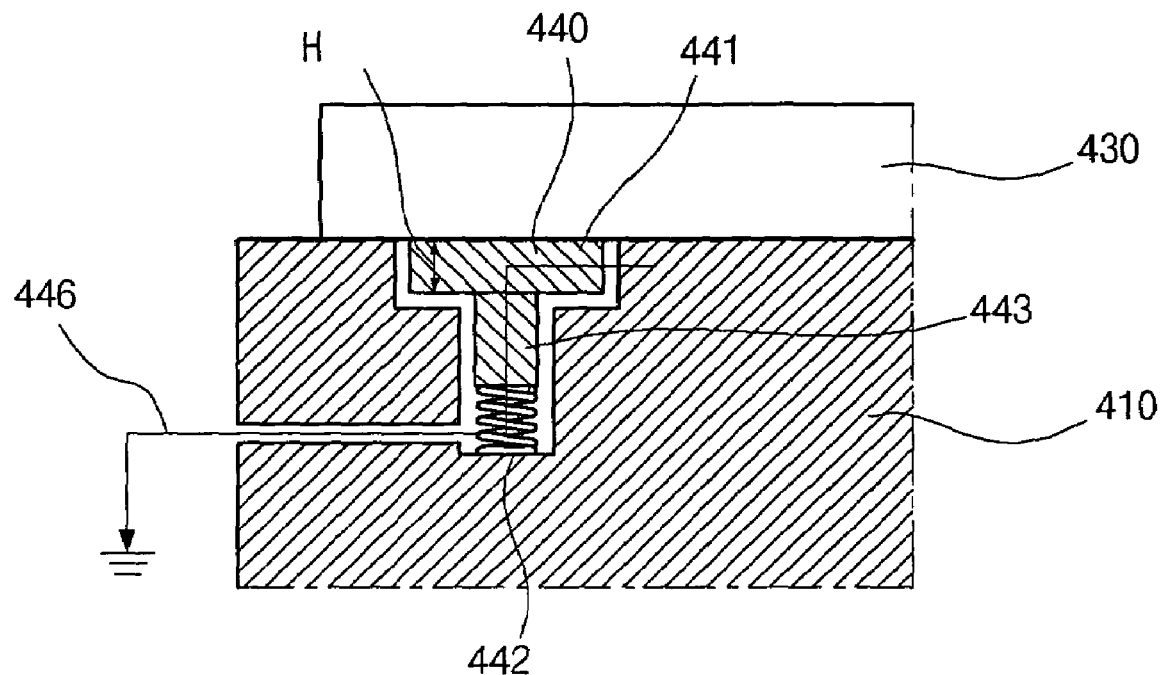
FIG. 5A is a cross-sectional view of an eletrostatic discharge (ESD) lift pin for a light exposure apparatus according to an exemplary embodiment of the present invention.
Figure 5B:
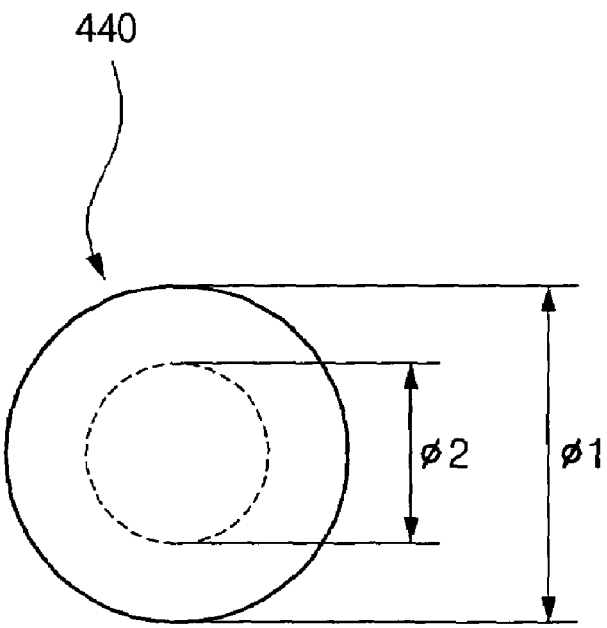
FIG. 5B is a plan view of the ESD lift pin for the light exposure apparatus of FIG. 5A.

FIGS. 5A and 5B are cross-sectional and plan views, respectively, of the ESD lift pin 440 for a light exposure apparatus according to an exemplary embodiment of the present invention. As shown in FIGS. 5A and 5B, the ESD lift pin 440 includes a plate 441, a supporter 443, an elastic body 442 and a ground line 446. The supporter 443 contacts a lower surface of the plate 441 to support the plate 441. The plate 441 and the supporter 443 may be each shaped like a cylinder. For example, as shown in FIG. 5B, the plate 441 may have a first diameter "$\phi 1$" of about 30 mm (millimeters), whereas the supporter 443 may have a second diameter "$\phi 2$" of about 20 mm (millimeters). Moreover, referring to FIG. 5A, the plate 441 may have a thickness "H" of about 10 mm (millimeters).

As shown in FIG. 5A, the elastic body 442 contacts a lower surface of the supporter 443 so that the ESD lift pin 440 is able to move up and down elastically. In this exemplary embodiment, the moving range of the ESD lift pin 440 may be about 10 mm (millimeters) according to an elastic operation of the elastic body 442. The elastic body 442 includes a spring. As shown in FIG. 5A, the ground line 446 is arranged in the ESD lift pin 440, so that positive electrostatic charges remaining at edges of the substrate 430 and the upper surface of chuck 410 can be grounded through the ground line 446.

In addition, the upper surface of the ESD lift pin 440 is arranged to be in a position higher than the upper surface of the chuck 410 when the lift pin 420 (of FIGS. 4A and 4B) is in an up position. The upper surface of the ESD lift pin 440 is arranged to be in the same position as the upper surface of the chuck 410 when the lift pin is in a down position and the substrate 430 is tightly attached to the upper surface of the chuck 410. Such an arrangement as well as loading and unloading operations of the substrate 430 will be given in detail with reference to FIGS. 6A to 6F.

Figure 6A:
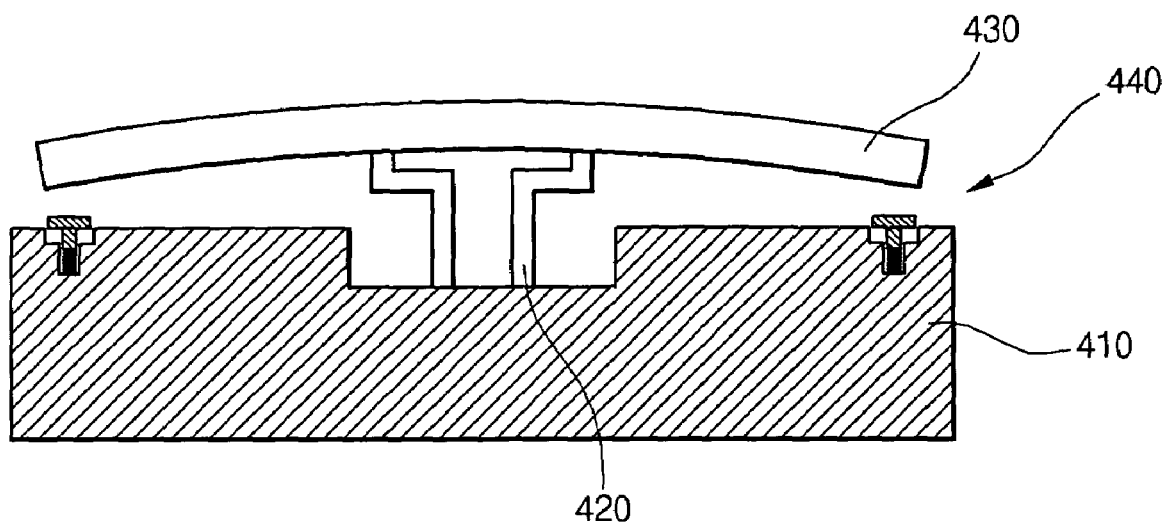
FIGS. 6A and 6B are cross-sectional views of a chuck and an ESD lift pin, respectively, for a light exposure apparatus according to an exemplary embodiment of the present invention when loading a substrate on the chuck.
Figure 6B:
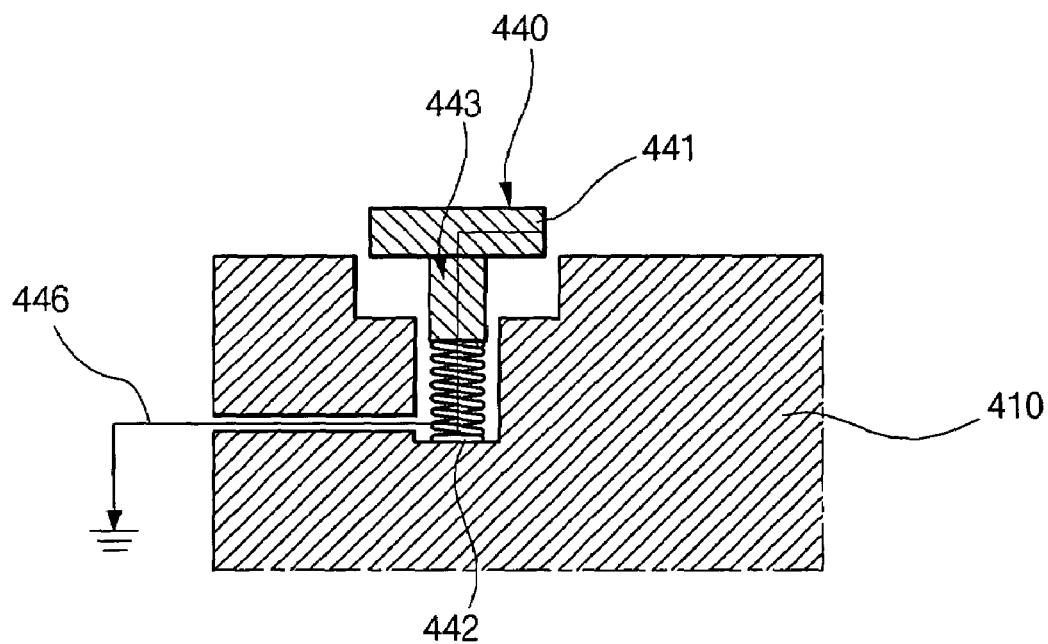

FIGS. 6A and 6B are cross-sectional views of the chuck 410 and the ESD lift pin 440 for the light exposure apparatus according to an exemplary embodiment of the present invention when loading the substrate 430. As shown in FIGS. 6A and 6B, when the lift pin 420 is in the up position, a robot puts the substrate 430 on the lift pin 420. Then, the lift pin 420 moves down until it reaches the down position. As the lift pin 420 moves down to place the substrate 430 on the chuck 410, peripheral portions of the substrate 430 are bent downward. As noted above, the ESD lift pin 440 is protruded to have its upper surface positioned higher than the upper surface of the chuck 410 when the lift pin 420 is in the up position. In this exemplary embodiment, the upper surface of the ESD lift pin 440 is about 10 mm (millimeters) higher than the upper surface of the chuck 410. Unlike the related art, in the exemplary embodiment, the bent peripheral portions of the substrate 430 contact the protruded ESD lift pin 440 before contacting the upper surface of the chuck 410. In such an arrangement, the ESD lift pin 440 takes a part of a weight of the substrate 430, thereby reducing a burden on the lift pin 420. Moreover, frictions between the chuck 410 and the substrate 430 are also reduced, and the static electricity is thus reduced. Further, any residual static electricity generated on the substrate 430 and the chuck 410 can be further removed through the ground line 446 in the ESD lift pin 440, thereby minimizing operational errors of the light exposure apparatus.

FIGS. 6C and 6D are cross-sectional views of the chuck 410 and the ESD lift pin 440 for the light exposure apparatus according to an exemplary embodiment of the present invention when adhering a substrate to a chuck. As shown in FIGS. 6C and 6D, when the lift pin 420 moves down to the down position to place the substrate 430 on the chuck 410, the vacuum hole 418 (of FIG. 4A) is inhaled to be in a vacuum condition, thereby closely adhering the substrate 430 to the chuck 410. At this time, the ESD lift pin 440 is also in the down position, and the surface of the ESD lift pin 440 is in the same level as the upper surface of the chuck 410 due to the vacuum hole 418 under vacuum and the weight of the substrate 430. Moreover, the elastic body 442 is compressed elastically. After the substrate 430 is tightly attached to the upper surface of the chuck 410, a light-exposing process is performed as shown in FIG. 1. that is, the light emitted from the light source 160 and passing through the photo-mask 150 irradiates the photoresist layer 140 on the thin film 131.

Figure 6E:
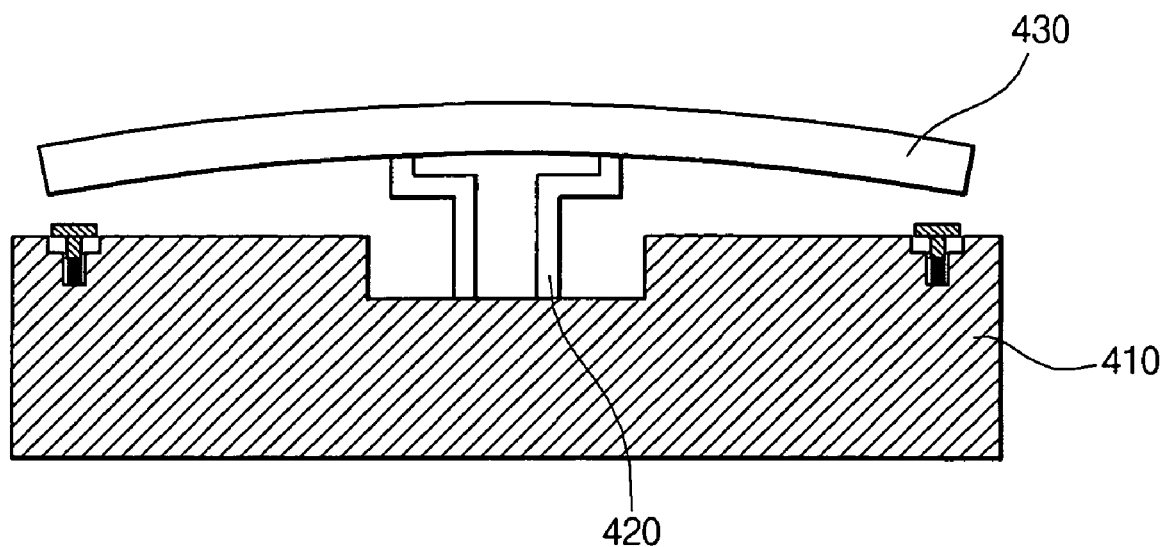
FIGS. 6E and 6F are cross-sectional views of a chuck and an ESD lift pin, respectively, for a light exposure apparatus according to an exemplary embodiment of the present invention when unloading a substrate from the chuck.
Figure 6F:
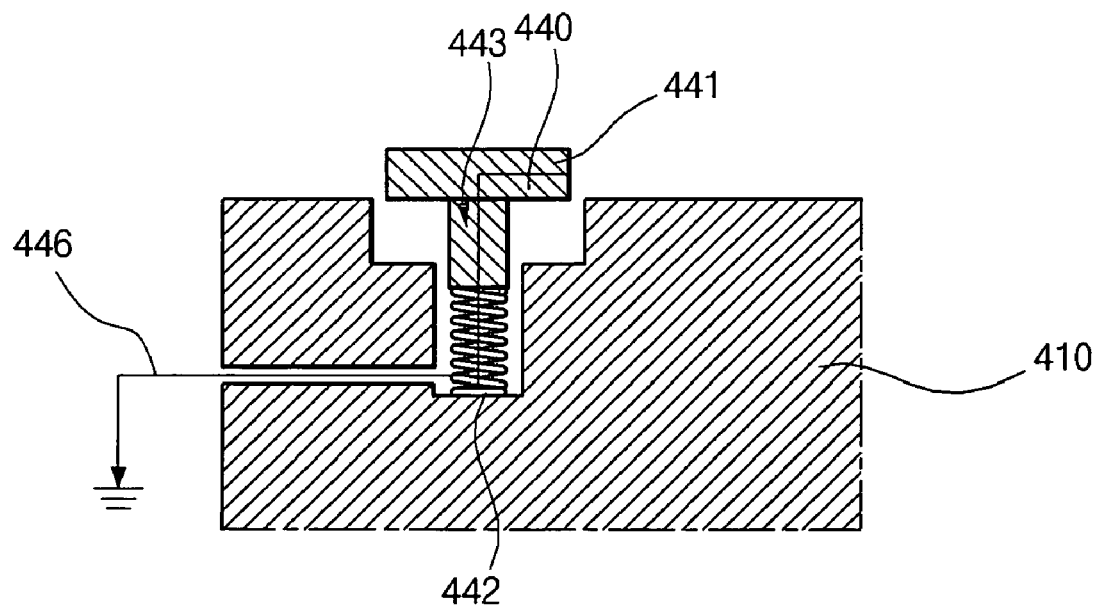

FIGS. 6E and 6F are cross-sectional views of the chuck 410 and the ESD lift pin 440 for a light exposure apparatus according to an exemplary embodiment of the present invention when unloading the substrate 430 from the chuck 410. As shown in FIGS. 6E and 6F, after the light-exposing process is completed, the lift pin 420 moves up to the up position. At the time when the lift pin 420 moves up, the peripheral portions of the substrate 430 rise due to an elastic decompression of the compressed elastic body 442 of the ESD lift pin 440. In this exemplary embodiment, the ESD lift pin 440 rises by 10 mm (millimeters) and has a decompressed original position higher than the upper surface of the chuck 410. Since the ESD lift pins 440 raise the peripheral portions of the substrate 430, a burden on the lift pin 420 is reduced. Also, since the static electricity generated on the substrate 430 and the chuck 410 is removed through the ground line 446 in the ESD lift pin 440, a spark discharge at edges, and in particular at corners of the substrate 430, can be prevented when the substrate 430 is detached from the chuck 410. When the lift pin 420 arrives at the up position, the robot holds up and transfers the substrate 430 for a following process.

Through the above-explained processes, the light-exposing process is performed by the light exposure apparatus according to an exemplary embodiment of the present invention. In the exemplary embodiment of the present invention, the light exposure apparatus is described. The chuck of the exemplary embodiment of the present invention can be applicable to an apparatus for fabricating a substrate, which has a chuck for treating a thin film on the substrate, such as a CVD (chemical vapor deposition) apparatus, a PECVD (plasma enhanced chemical vapor deposition) apparatus and an etcher.

It will be apparent to those skilled in the art that various modifications and variations can be made in the light exposure apparatus of the present invention without departing from the spirit or scope of the invention. For instance, the present invention may also be applied to other display devices. Thus, it is intended that the present invention cover the modifications and variations of this invention provided they come within the scope of the appended claims and their equivalents.

What is claimed is:

1. A light exposure apparatus for fabricating a substrate of a liquid crystal panel, comprising:
    a chuck adapted to receive the substrate of the liquid crystal panel on a surface of the chuck;
    a plurality of first lift pins in the chuck that are able to move up and down to load/unload the substrate on/from the surface of the chuck, the plurality of first lift pins symmetrically arranged in a center portion of the chuck; and
    a plurality of second lift pins in the chuck to discharge electrostatic charges of the chuck and the substrate, wherein each of the plurality of second lift pins includes a plate contacting the substrate, a supporter supporting and contacting a lower surface of the plate, and an elastic body contacting a lower surface of the supporter to elastically move up and down each of the plurality of second lift pins, and wherein the plate has a first diameter and the supporter has a second diameter smaller than the first diameter,
    wherein a burden of the plurality of first lift pins is reduced such that the plurality of second lift pins take a part of a weight of the substrate when the substrate is loaded on the chuck and raise the substrate when the substrate is unloaded from the chuck, and wherein an up position of the plurality of first lift pins is higher than an up position of the second lift pins and a down position of the plurality of first lift pins is the same as a down position of the plurality of second lift pins.

2. The apparatus according to claim 1, wherein each of the plurality of second lift pins includes a ground line to discharge the electrostatic charges.

3. The apparatus according to claim 1, wherein the plurality of second lift pins are able to move up and down elastically.

4. The apparatus according to claim 1, wherein the plurality of second lift pins are arranged corresponding to edge portions of the substrate.

5. The apparatus according to claim 3, wherein the plurality of second lift pins have surfaces at the same position as the surface of the chuck when the substrate is attached to the surface of the chuck.

6. The apparatus according to claim 5, wherein the surfaces of the plurality of second lift pins are able to be lifted by about 10 mm.

7. The apparatus according to claim 1, wherein the plate includes a diameter of about 30 mm and the supporter includes a diameter of about 20 mm.

8. The apparatus according to claim 1, further comprising a plurality of vacuum holes in the chuck to closely adhere the substrate to the surface of the chuck.

9. An apparatus for fabricating a substrate, comprising:
a chuck adapted to receive the substrate on a surface thereof;
a plurality of first lift pins in the chuck to move up and down to load/unload the substrate on/from the surface of the chuck, the plurality of first lift pins symmetrically arranged in a center portion of the chuck; and
a plurality of second lift pins in the chuck to discharge electrostatic charges of the chuck and the substrate, wherein each of the plurality of second lift pins includes a plate contacting the substrate, a supporter supporting and contacting a lower surface of the plate, and an elastic body contacting a lower surface of the supporter to elastically move up and down each of the plurality of second lift pins, and wherein the plate has a first diameter and the supporter has a second diameter smaller than the first diameter,
wherein a burden of the plurality of first lift pins is reduced such that the plurality of second lift pins take a part of a weight of the substrate when the substrate is loaded on the chuck and raise the substrate when the substrate is unloaded from the chuck and wherein an up position of the plurality of first lift pins is higher than an up position of the second lift pins and a down position of the plurality of first lift pins is the same as a down position of the plurality of second lift pins.

10. The apparatus according to claim 9, wherein each of the plurality of second lift pins includes a ground line to discharge the electrostatic charges.

11. The apparatus according to claim 9, wherein the plurality of second lift pins are able to move up and down elastically.

12. The apparatus according to claim 9, wherein the plurality of second lift pins are arranged corresponding to edge portions of the substrate.

13. The apparatus according to claim 9, further comprising a plurality of vacuum holes in the chuck to closely adhere the substrate to the surface of the chuck.

14. A light exposure apparatus for fabricating a substrate of a liquid crystal panel, comprising:
a light source adapted to emit ultra-violet light;
a photo mask including predetermined patterns that selectively transmit and block the light emitted from the light source;
a chuck adapted to support the substrate that is exposed to the light through the photo mask;
a plurality of first lift pins in the chuck that are able to move up and down to load/unload the substrate on/from the chuck, the plurality of first lift pins symmetrically arranged in a center portion of the chuck;
a plurality of second lift pins in the chuck to discharge electrostatic charges of the chuck and the substrate, wherein each of the plurality of second lift pins includes a plate contacting the substrate, a supporter supporting and contacting a lower surface of the plate, and an elastic body contacting a lower surface of the supporter to elastically move up and down each of the plurality of second lift pins, and wherein the plate has a first diameter and the supporter has a second diameter smaller than the first diameter,
wherein a burden of the plurality of first lift pins is reduced such that the plurality of second lift pins take a part of a weight of the substrate when the substrate is loaded on the chuck and raise the substrate when the substrate is unloaded from the chuck, and wherein an up position of the plurality of first lift pins is higher than an up position of the second lift pins and a down position of the plurality of first lift pins is the same as a down position of the plurality of second lift pins.

15. The apparatus according to claim 14, wherein the plurality of second lift pins are able to move up and down elastically.

16. The apparatus according to claim 15, wherein each of the plurality of second lift pins includes a ground line to discharge the electrostatic charges.

17. The apparatus according to claim 15, wherein the plurality of second lift pins have surfaces positioned at a same level as the surface of the chuck when the substrate is placed on the chuck and positioned at a higher level than the surface of the chuck when the substrate is unloaded from the chuck.

18. The apparatus according to claim 17, wherein the surfaces of the plurality of second lift pins are able to be lifted by about 10 mm.

* * * * *